(12) United States Patent
Zhang et al.

(10) Patent No.: US 12,354,650 B2
(45) Date of Patent: Jul. 8, 2025

(54) INTEGRATED CIRCUITS WITH SINGLE-FUNCTIONAL-UNIT LEVEL INTEGRATION OF ELECTRONIC AND PHOTONIC ELEMENTS

(71) Applicant: The University of North Carolina at Charlotte, Charlotte, NC (US)

(72) Inventors: Yong Zhang, Charlotte, NC (US); Antardipan Pal, Charlotte, NC (US); Dennis Yau, Cupertino, CA (US)

(73) Assignee: The University of North Carolina at Charlotte, Charlotte, NC (US)

( * ) Notice: Subject to any disclaimer, the term of this patent is extended or adjusted under 35 U.S.C. 154(b) by 350 days.

(21) Appl. No.: 17/963,424

(22) Filed: Oct. 11, 2022

(65) Prior Publication Data

US 2023/0038024 A1 Feb. 9, 2023

Related U.S. Application Data

(63) Continuation-in-part of application No. 17/103,154, filed on Nov. 24, 2020, now abandoned.

(60) Provisional application No. 62/945,546, filed on Dec. 9, 2019, provisional application No. 63/117,664, filed on Nov. 24, 2020.

(51) Int. Cl.
*G11C 11/42* (2006.01)
*G11C 11/418* (2006.01)
*G11C 11/419* (2006.01)

(52) U.S. Cl.
CPC ............ *G11C 11/42* (2013.01); *G11C 11/418* (2013.01); *G11C 11/419* (2013.01)

(58) Field of Classification Search
CPC ..... G11C 11/42; G11C 11/418; G11C 11/419; G11C 11/413; G11C 13/047
See application file for complete search history.

(56) References Cited

U.S. PATENT DOCUMENTS

2004/0264868 A1* 12/2004 Block ............... G02B 6/12002
385/50
2005/0207204 A1* 9/2005 Tam ...................... H10B 53/40
257/E27.122

(Continued)

OTHER PUBLICATIONS

Lakshmi et al., A Review on Sram Memory Design Using Finfet Technology, Research Square, Posted Date: Jul. 1, 2022, https://doi.org/10.21203/rs.3.rs-1586549/v1.

(Continued)

*Primary Examiner* — Bitew A Dinke
(74) *Attorney, Agent, or Firm* — McDonnell Boehnen Hulbert & Berghoff LLP

(57) ABSTRACT

Example memory devices and example methods for using memory devices are described. An example memory device may include a first electrical bitline, a second electrical bitline, a bitcell, and an optical waveguide wordline. The bitcell is configured to store a bit value and includes storage circuitry and a pair of light-effect transistor access devices. The storage circuitry includes at least one transistor. The pair of light-effect transistor access devices are arranged for connecting the bitcell to the first electrical bitline and the second electrical bitline. The optical waveguide wordline is arranged for routing an optical signal to the pair of light-effect transistor access devices.

20 Claims, 10 Drawing Sheets

(56) References Cited

U.S. PATENT DOCUMENTS

| | | | |
|---|---|---|---|
| 2015/0207563 A1* | 7/2015 | Cho | H04B 10/2589 |
| | | | 398/115 |
| 2017/0104312 A1* | 4/2017 | Zhang | H01S 5/06808 |
| 2019/0197947 A1* | 6/2019 | Miyasaka | G02B 27/0172 |
| 2020/0365464 A1* | 11/2020 | Sreenivasan | H01L 21/823807 |
| 2023/0038024 A1* | 2/2023 | Zhang | G11C 11/418 |

OTHER PUBLICATIONS

Bikki et al., SRAM Cell Leakage Control Techniques for Ultra Low Power Application: A Survey, Scientific Research Publishing, Circuits and Systems, 2017, 8, 23-52, http://www.scirp.org/journal/cs.

Sun et al., Single-chip microprocessor that communicates directly using light, Nature, 528(7583), Dec. 1, 2015, https://escholarship.org/uc/item/4dh1v4px.

Pleros et al., Optical Static RAM Cell, IEEE Photonics Technology Letters, vol. 21, No. 2, Jan. 15, 2009.

Alexoudi et al., Optical RAM and integrated optical memories: a survey, Light: Science & Applications ( 2020) 9:91, Official journal of the CIOMP 2047-7538, www.nature.com/lsa, https://doi.org/10.1038/s41377-020-0325-9.

Pal et al., Monolithic and single-functional-unit level integration of electronic and photonic elements: FET-LET hybrid 6T SRAM, vol. 9, No. 7 / Jul. 2021 / Photonics Research, https://doi.org/10.1364/PRJ.420887.

Pal et al., Proposal of a FET-LET Hybrid 6T Sram, 8 pages.

\* cited by examiner

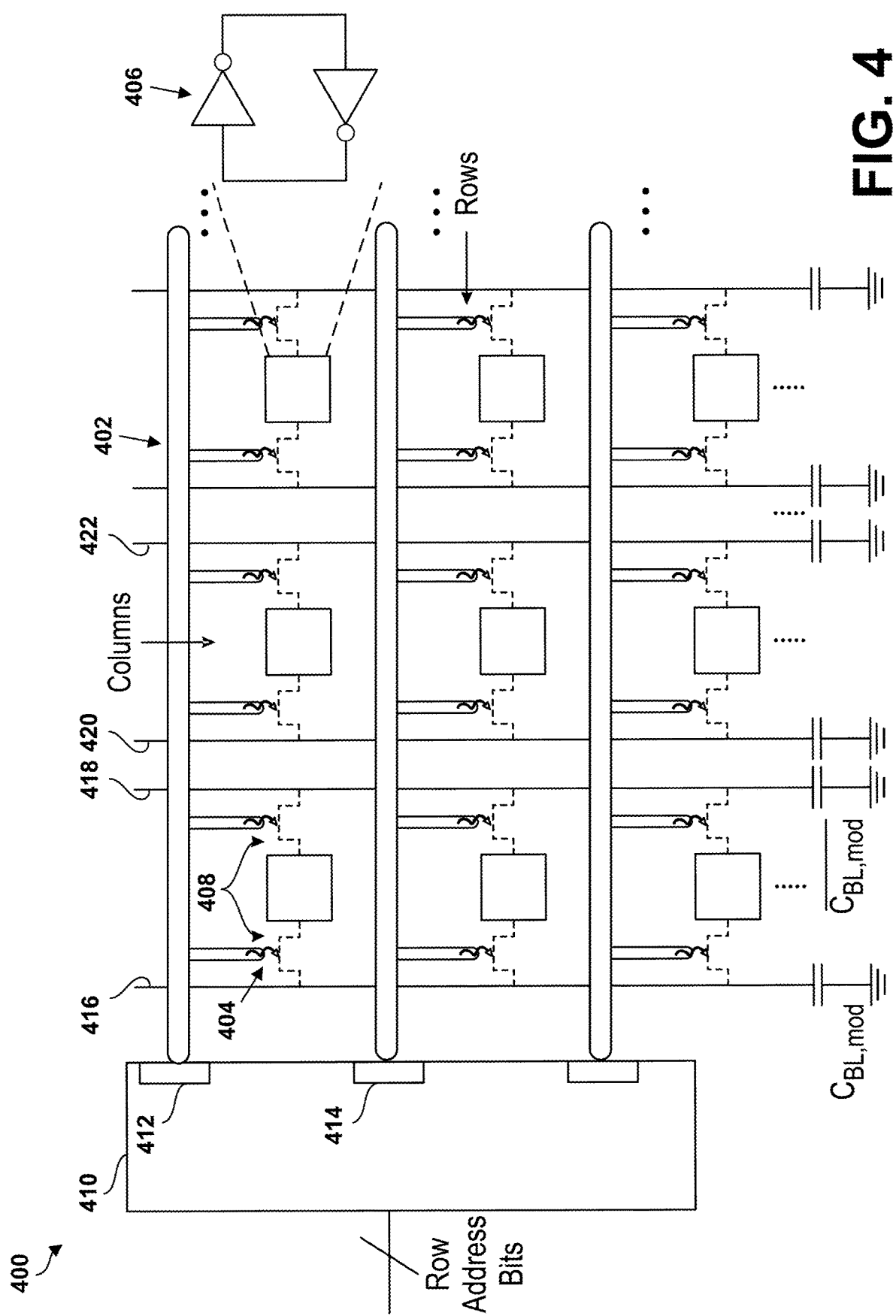

INTEGRATED CIRCUITS WITH SINGLE-FUNCTIONAL-UNIT LEVEL INTEGRATION OF ELECTRONIC AND PHOTONIC ELEMENTS

CROSS-REFERENCE TO RELATED APPLICATIONS

This disclosure is a continuation-in-part of U.S. patent application Ser. No. 17/103,154 filed Nov. 24, 2020, which claims priority to U.S. Provisional Application No. 62/945,546 filed Dec. 9, 2019 and U.S. Provisional Application No. 63/117,665 filed Nov. 24, 2020, each of which is hereby incorporated by reference in its entirety.

BACKGROUND

For decades, the downscaling of complementary metal oxide semiconductor (CMOS) technology has followed Moore's law in order to obtain both improved performance and lower power consumption. In the data-centric era, the CMOS scaling is focusing more on low voltages, cost-effective processes, and high performance to meet the requirements of high-end mobile applications. Besides new technologies that have been developed on improving the performance on a device level, the geometrical layout of the CMOS circuit has also been changed from planar to three-dimension by overcoming various integration issues. Furthermore, techniques that allow heterogeneous integration of different material systems (e.g., Si, Ge, and III-V groups) have been developed. Photonic integrated circuits (PICs) are increasingly used to provide solutions to the limitations of pure electronic integrated circuits and to increase capacity and speed of data transmission between electronic subsystems. Together, they are also referred to as electronic-photonic integrated circuits (EPICs). However, due to a few major limitations in EPICs, primarily (1) the size-mismatch between the light wavelength and electronic component, (2) energy date rate between single component level data exchange between the electronic and optical component, and (3) cascadability of the optical logic operation, a higher level electronic-photonic integration, for instance, single-functional-unit level integration of electronic and photonic elements, remains elusive.

SUMMARY

In one example, a memory device is described. The memory device includes a first electrical bitline, a second electrical bitline, a bitcell, and an optical waveguide wordline. The bitcell is configured to store a bit value and includes storage circuitry and a pair of light-effect transistor access devices. The storage circuitry includes at least one transistor. The pair of light-effect transistor access devices are arranged for connecting the bitcell to the first electrical bitline and the second electrical bitline. The optical waveguide wordline is arranged for routing an optical signal to the pair of light-effect transistor access devices.

In another example, a memory device is described. The memory device includes an array of bitcells and an optical waveguide wordline. Each bitcell of the array of bitcells is configured to store a respective bit value using storage circuitry including at least one transistor. Each bitcell of the array of bitcells includes a pair of light-effect transistor access devices arranged for connecting the bitcell to a pair of corresponding electrical bitlines. The optical waveguide wordline is arranged for routing an optical signal to a pair of light-effect transistor access devices of a bitcell of the array of bitcells.

In another example, a method of accessing a bitcell of a memory device is described. The bitcell includes storage circuitry including at least one transistor. The method involves illuminating a pair of light-effect transistor access devices of the bitcell using an optical waveguide wordline. Illuminating the pair of light-effect transistor access devices connects a first electrical bitline to the storage circuitry by way of a first light-effect transistor access device of the pair of light-effect transistor access devices and connects a second electrical bitline to the storage circuitry by way of a second light-effect transistor access device of the pair of light-effect transistor access devices. The method also includes writing a bit value to the bitcell using the first electrical bitline and the second electrical bitline.

The foregoing summary is illustrative only and is not intended to be in any way limiting. In addition to the illustrative aspects, embodiments, and features described above, further aspects, embodiments, and features will become apparent by reference to the following detailed description and accompanying figures.

BRIEF DESCRIPTION OF THE FIGURES

FIG. 4 illustrates another example memory device.

DETAILED DESCRIPTION

Figure 1:
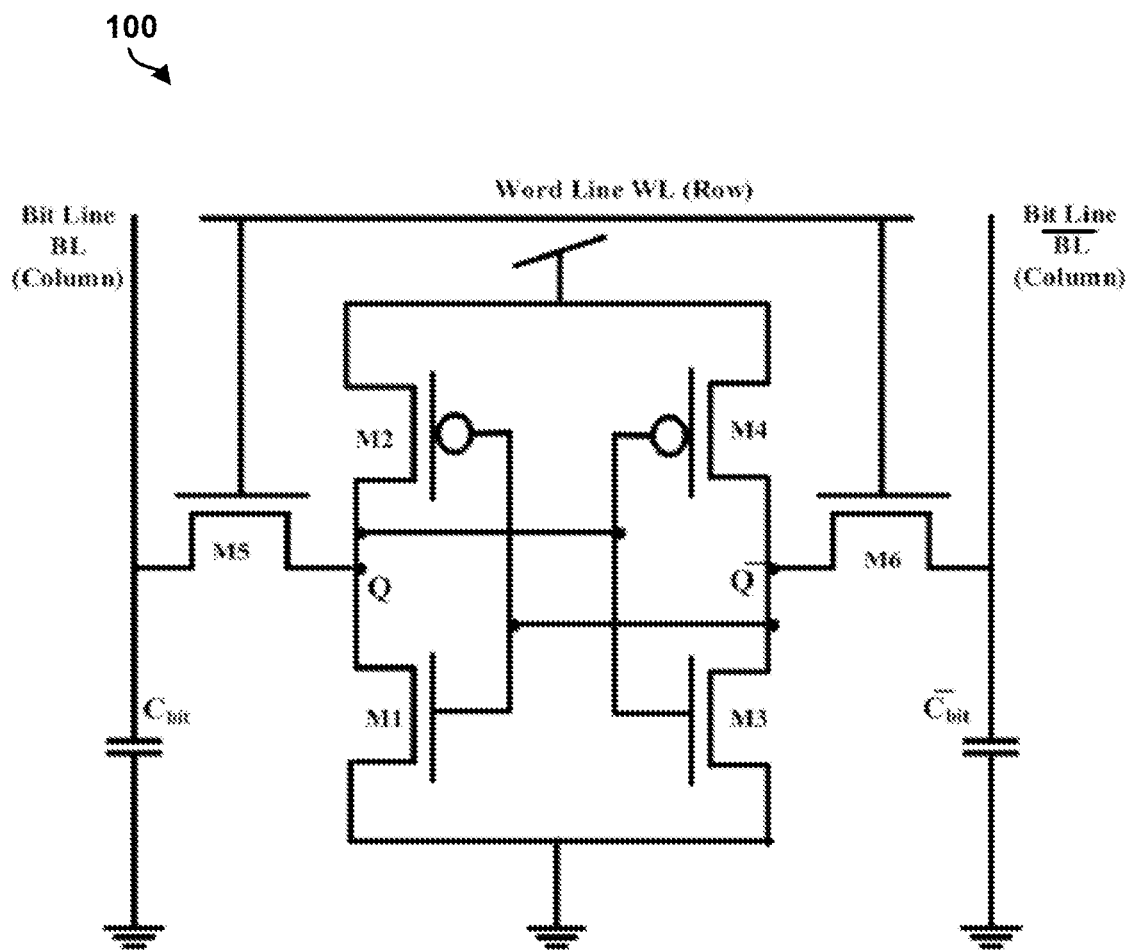
FIG. 1 illustrates a conventional six transistor (6T) SRAM cell.

Example systems and methods are described herein. Any example embodiment or feature described herein is not necessarily to be construed as preferred or advantageous over other embodiments or features. The example embodiments described herein are not meant to be limiting. It will be readily understood that certain aspects of the disclosed systems and methods can be arranged and combined in a wide variety of different configurations, all of which are contemplated herein.

Furthermore, the particular arrangements shown in the Figures should not be viewed as limiting. It should be understood that other embodiments might include more or less of each element shown in a given Figure. Further, some of the illustrated elements may be combined or omitted. Yet further, an example embodiment may include elements that are not illustrated in the figures.

As discussed above, new technologies have been developed that improve the performance of CMOS semiconductor technology at the device level. In addition, the geometric layout of the CMOS circuit has been improved, and techniques that allow heterogeneous integration of different material systems have been developed. Unfortunately, however, these developments cannot address the fundamental limitations of CMOS circuits, the resistive capacitive (RC) delay associated with metallic wires, and the dielectric gate delay associated with field-effect transistors (FETs). These delays ultimately limit data speed and energy consumption.

In the meantime, it has been recognized that integrating electronic and photonic elements on the same chip can potentially transform computing architectures and enable more powerful computers. It is now possible to integrate a large number of electronic devices and photonic components on a single chip to perform logic, memory, and interconnect functions. However, oftentimes, the photonic components only play the roles of providing high-speed communications between different electronic subsystems, for instance, between processor and static random access memory (SRAM) or in a photonic dynamic random access memory (DRAM), rather than any active roles in processing or modifying information like logic gates.

Both key advantages and challenges of photonic circuits can be generally understood without resolving to detailed circuit designs. Despite the advantage of photonic devices in speed, there are three major challenges to integrating photonic and electronic devices more closely: size mismatch, energy data rate (EDR), and cascadability. For example, although photoconductive devices can potentially offer advantages in switching speed and switching energy, one major drawback of using such devices, such as light-effect transistors (LETs), is the inconvenience of using the output of one LET-based logic gate to directly drive the next similar logic gate without going through relatively inefficient electrical to optical energy conversion.

Disclosed herein are devices, systems, and methods that address these and potentially other issues. Within examples, some of the FETs of an electronic integrated circuit that only serve the roles of switching on and off, such as the access transistors in a conventional SRAM cell, are replaced by LETs, and accordingly, the metallic wordlines are replaced by optical waveguides (OWGs). This hybrid approach can alleviate the three challenges. For instance, in a memory device having LET access devices, the LET access devices can be addressed in a group simultaneously rather than individually. Moreover, the use of LET access devices in memory devices represents a unique approach that can offer a major improvement in the read and writes speeds and the corresponding energy consumptions as compared with conventional memory devices.

An example memory device includes a first electrical bitline, a second electrical bitline, a bitcell configured to store a bit value, and an OWG wordline. The bitcell includes storage circuitry including at least one transistor. The bitcell also includes a pair of LET access devices arranged for connecting the bitcell to the first electrical bitline and the second electrical bitline. The OWG wordline, in turn, is arranged for routing an optical signal to the pair of LET access devices.

An example method of accessing a bitcell of such a memory device involves illuminating the pair of LET access devices of the bitcell using the OWG wordline. Illuminating the pair of LET access devices connects the first electrical bitline to the storage circuitry by way of a first LET access device of the pair of LET access devices and connects the second electrical bitline to the storage circuitry by way of a second LET access device of the pair of LET access devices. The method also includes writing a bit value to the bitcell using the first electrical bitline and the second electrical bitline.

Various example implementations of these memory devices and methods are described below with reference to the figures.

Some of the examples described hereinafter refer to SRAM cells by way of example. However, one of ordinary skill in the art will appreciate that the FET-LET hybrid technology disclosed herein is applicable to other integrated circuits as well. Hence, the examples are not meant to be limiting. Likewise, although portions of this disclosure refer to 6T SRAM cells, the techniques are also applicable to other versions of SRAM cells, such as 4T SRAM cells and 8T SRAM cells.

In line with the discussion above, one concern in many ultralow-power applications is energy efficiency. Because SRAM is one of the most common building blocks in many digital systems, its packing density, speed, and power consumption affect performance metrics. SRAMs are sometimes used as high-speed cache memories providing a direct interface with a central processing unit at high speeds which might not be possible to attain by other memory circuits.

However, on-chip caches typically consume 25%-45% of the total energy of a chip. Moreover, in modern high-performance large-density memory circuits, more than 40% of the total energy is consumed due to leakage currents. Hence, high-speed and energy-efficient embedded memories are desirable for a modern electrical system. Various device and circuit techniques have been proposed to improve the overall performance of SRAM and reduce the leakage in SRAM structures, but none are related to photonics.

FIG. 1 illustrates a conventional 6T SRAM cell 100. As shown in FIG. 1, the 6T SRAM cell 100 includes six FETs M1-M6. M1, M2 and M3, M4 from cross-coupled inverter pairs (latches), and M5, M6 are access devices that allow the data stored in the cell to be accessed and modified by charging and discharging the output nodes Q and Q and bitlines BL and BL. The two access transistors M5, M6 influence the overall speed, power dissipation, and stability of the 6T SRAM cell 100. Many approaches in both device and circuit levels have been explored to offer various incremental improvements in the SRAM performance, particularly in speed and energy consumption.

The FET-LET hybrid 6T SRAM technology described herein represents a drastically different approach that can offer a major improvement on the read and write speeds and the corresponding energy consumption after replacing the two access FETs with two LETs, and accordingly the wordline electrical wires with OWGs.

The primary factors limiting the read and write speeds and the corresponding energy consumptions are the bitlines and wordlines, and the characteristics of the access transistors. As good estimates, the critical capacitances of a 6T SRAM cell can be calculated as follows:

$$C_{BL} = n_R(C_{drain\_access} + C_{ht}), \quad (1)$$

$$C_{WL} = n_C(2C_{gate\_access} + C_{width}), \quad (2)$$

$$C_{out} = C_Q = C_{drain,M1} + C_{drain,M2} C_{gate,M3} C_{gate,M4} C_{drain,M5}, \quad (3)$$

where $C_{BL}$ is the bitline capacitance, $C_{WL}$ is the wordline capacitance; $C_{out}$ is the capacitance of the output node (node Q in FIG. 1); $C_{drain}$ and $C_{gate}$ are the drain and gate capacitances, respectively, of the relevant devices; $n_R$ and $n_C$ are the number of rows and columns, respectively, for the SRAM array.

The read and write delays are estimated as follows:

$$T_{read} = \frac{C_{WL}V_{dd}}{I_{word\_drive}} + \frac{C_{BL}\Delta V_{read}}{I_{read}}, \quad (4)$$

$$T_{write} = \max\left(\frac{C_{WL}V_{WL}}{I_{WL}}, \frac{C_{BL}V_{dd}}{I_{write\_ckt}}\right) + \frac{C_{out}\Delta V_{out}}{I_{write}}, \quad (5)$$

where $I_{read}$ and $I_{write}$ are the 6T cell read and write currents respectively; $I_{word\_drive}$, $I_{WL}$, and $I_{write\_ckt}$ are the wordline driver, wordline, and write circuitry currents, respectively; $\Delta V_{read}$ and $\Delta V_{out}$ are respectively the change in the bitline voltage after a read operation and the change of output voltage after a write operation; and $V_{DD}$ is the supply voltage.

And the read and write energies are calculated as follows:

$$E_{read} = C_{WL}V_{DD}^2 + C_{BL}V_{DD}\Delta V_{read}, \quad (6)$$

$$E_{write} = C_{WL}V_{DD}V_{WL} + C_{BL}V_{DD}^2 + C_{out}V_{DD}\Delta V_{out}, \quad (7)$$

where $V_{WL} = V_{DD}$ is the wordline voltage during the read or write operation. For the above delay and energy questions of the 6T array, the delay and switching energy due to the transit of carriers through the FET channel have not been considered, since they are negligible compared to the gate related RC delays and energies. As evident from the above formulas, the access transistors and the ways to address them affect the overall SRAM cell performance. Therefore, if the access devices can be replaced with some high-speed switching devices with very low gate, source, and drain junction capacitances, such as LETs, and also can be addressed more efficiently, major improvement in speed and power consumption can be achieved.

There are various types of leakage currents in a modern FET that contribute to the energy loss. They include sub-threshold leakage current, gate leakage, and junction leakage currents. Although in the static state, the leakage currents of the two inverters may dominate the static energy consumption, during the write and read processes, the leakage of access transistors M5, M6 also contributes to the total energy consumption. It can be roughly estimated that in a 6T cell about 40% of the total leakage components are in the access paths of the cell.

Figure 2:
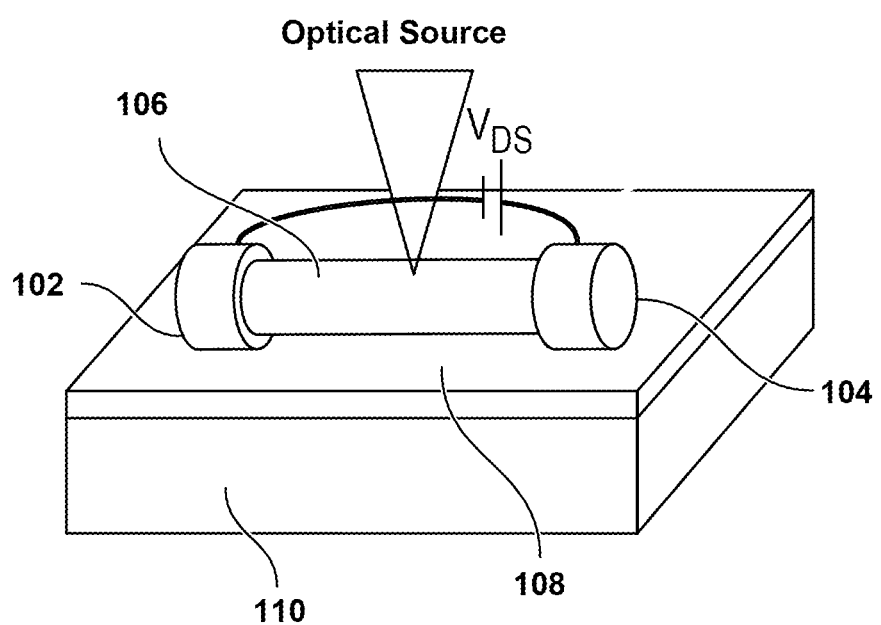
FIG. 2 illustrates an example light-effect transistor (LET).

FIG. 2 illustrates an example LET 200. As shown in FIG. 2, the LET 200 includes a source contact 102, a drain contact 104, and a semiconductor nanostructure channel 106 connecting the source contact 102 and the drain contact 104. The source contact 102 and the drain contact 104 overlay an insulating dielectric 108, which in turn rests upon a substrate 110.

In one example, the source contact 102 and drain contact 104 may each be metal contacts, and the semiconductor nanostructure channel 106 may be a semiconductor nanowire. Further, the insulating dielectric 108 may be a silicon oxide layer and the substrate 110 may be a silicon substrate. In other examples, LETs may have larger size semiconductor channels. Hence, the semiconductor channel is not limited to nanoscale channels.

The working mechanism of an LET is different from that of a traditional FET in that the source-drain conductivity of an LET is modulated by light or electromagnetic radiation of a suitable wavelength as in a photoconductive mechanism. The advantage of an LET over an FET stems from various factors, such as removal of physical gate, thus minimizing the complex gate fabrication process and random dopant fluctuations in FETs. Hence, the LET can be scaled down to the quantum regime without the problem of short-channel effects (SCEs) that are common in nanoscale FETs. Also, because the LET structure does not have a physical gate, the device speed is expected to be only limited by the carrier transit time or lifetime, whichever is smaller, rather than the capacitive delay as in the gated FET.

At room temperature, many semiconductors (e.g., Si, SiC, InAs, InP, GaAs, CdSe) have saturation electron velocities in the range of $10^7$-$10^8$ cm/s when the electrical field is of the order of 100 kV/cm, which implies a carrier transit time of the order of 1-0.1 ps for a 100 nm long nanowire. 100 nm is also the typical length scale of ballistic transport where the saturation velocity can be achieved. For longer nanowires in the non-ballistic transport regime, the electron transit time depends on the electrical field. For Si at E=10 kV/cm, electron velocity is around $7 \times 10^6$ cm/s, and the carrier transit time $t_{LET}$ can be estimated to be 4.3 ps for a 300 nm long Si nanowire. If the nanowire in the LET can be scaled down to operate in the ballistic regime (typically ≤100 nm), then ultrafast switching (of the order of 1 ps or faster) can be obtained. The ultrafast switching of the LET translates to ultrasound switching energy. For instance, assuming a switching time (carrier transit time) $t_{LET}$=1 ps (for a ballistic device), and an on-current of $I_{sd}$=1 μA under $V_{sd}$=1 V, the electrical switching energy $E_{el}$ (= $I_{sd}V_{sd}t_{LET}$) will be of the order of 1 aJ/switch.

However, in the LET, optical gating power also contributes to the switching energy. The net gating power required can be estimated by $P_g = E_{ph}I_{sd}/(eG)$, where $E_{ph}$ is the photon energy and G is the photoconductive gain. Assuming the photon energy is 2.5 eV, the photoconductive gain is $10^3$, to have the on-current of 1 μA, we get the net gating power of 2.5 nW. Then, assuming the carrier transit time is 1 ps, the optical switching energy $E_{op}$ will be $2.5 \times 10^{-3}$ aJ/switch<<$E_{el}$, which leaves sufficient room allowing for below 100% light power delivery efficiency. In an even more idealistic case, assuming a ballistic device with a quantum impedance of 12.9 kΩ, transit time of 0.1 ps, S-D current of 1 μA, and no voltage loss at the contacts, the electrical switching energy can be as low as $1.3 \times 10^{-21}$ J/switch at a very low $V_{sd}$ of only 13 mV. A prototype device with a single CdSe nanowire LET of 5 μm in length and 80 nm in diameter, under 532 nm illumination of 110 nW, can yield $I_{ds}$=0.35 μA at $V_{ds}$=1.43V; in dark, $I_{ds}$ of approximately 1 pA, which corresponds to about 1.5 pW static or off power. Estimating the switching energy for such a large device using the typical room temperature carrier lifetime in a II-VI semiconductor of the order of 100 ps, the total switching energy $E_{tot,sw} = E_{el} + E_{op} \approx 0.06$ fJ/switch, which would still be better than typical FETs having switching energy of the order of 0.1-1 fJ/switch.

In FETs, the gate related RC delays predominate over the carrier transit-time delay; but in the LET, the carrier transit time through the nanowire channel is expected to be the predominate factor for determining the switching speed and energy of a discrete LET. Moreover, the $I_{on}/I_{off}$ ratio for an LET could be as high as $10^6$, which is almost an order of magnitude better than that of advanced FETs. This reduces the leakage (leakage due to dark current) in the access paths and offers more flexibility in the 6T cell design with LET access devices.

Figure 3:
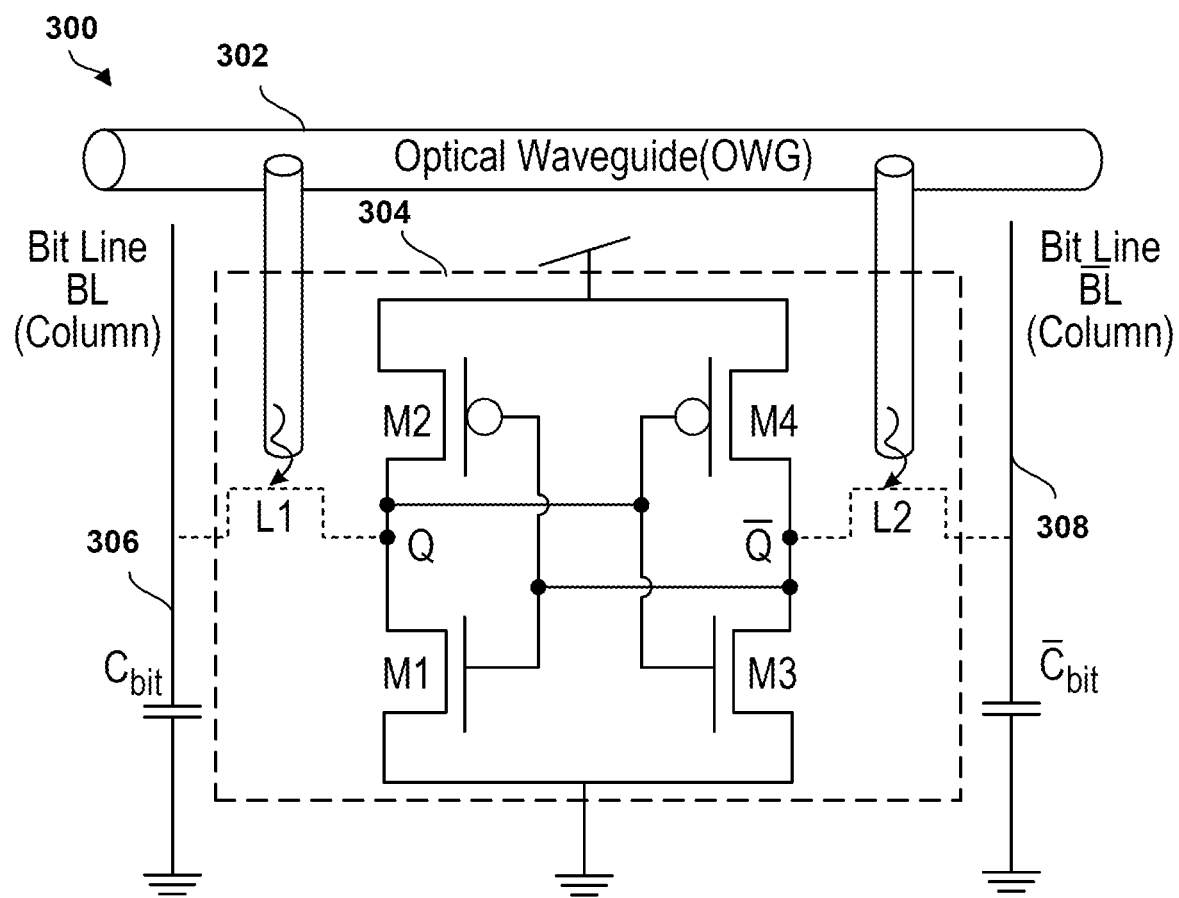
FIG. 3 illustrates an example memory device.

FIG. 3 illustrates an example memory device 300. The memory device 300 is an example of an integrated circuit unit, namely a hybrid 6T SRAM. The memory device 300 is similar to the 6T SRAM cell 100 of FIG. 1. However, the memory device 300 differs from the 6T SRAM cell 100 in that the access transistors M5, M6 are replaced with LET access devices L1, L2. The memory device 300 also differs from the 6T SRAM cell 100 in that the wordline is replaced by an OWG wordline 302 that transmits lights to the LET access devices L1, L2.

As shown in FIG. 3, the memory device 300 includes a bitcell 304. The bitcell 304 can be a random access memory bitcell, such as an SRAM bitcell. The bitcell 304 includes storage circuitry having at least one transistor. More specifically, the storage circuitry includes four FETs forming cross-coupled inverter pairs. In other examples, the storage circuitry can take other forms.

The LET access devices L1, L2 are also part of the bitcell 304. The LET access devices can be LETs, such as the LET 200 of FIG. 2. The LET access device L1 is arranged for connecting a first electrical bitline 306 to the storage circuitry. For instance, a source contact of the LET access device L1 can be connected to the first electrical bitline 306, and a drain contact of the LET access device L1 can be connected to the node Q. The LET access device L2 is arranged for connecting a second electrical bitline 308 to the storage circuitry. For instance, a source contact of the LET access device L2 can be connected to the second electrical bitline 308, and a drain contact of the LET access device L2 can be connected to the node Q.

The OWG wordline 302 is arranged for routing an optical signal to the LET access devices L1, L2. For instance, the OWG wordline 302 can be arranged for routing an optical signal to semiconductor nanowires of the LET access devices L1, L2. A computing system can illuminate the OWG wordline using any suitable source, such as one or more nanoscale lasers.

FIG. 4 illustrates another example memory device 400. The memory device 400 is an example of an integrated circuit, namely a hybrid 6T SRAM array. The memory device 400 is similar to the memory device 300 in FIG. 3. However, the memory device 400 differs from the memory device 300 in that the memory device 400 includes multiple optical waveguide wordlines 402 and an array of bitcells 404.

Each bitcell of the array of bitcells 404 is similar to the bitcell 304 of FIG. 3. As shown, each bitcell includes storage circuitry 406 as well as a pair of LET access devices 408. Each bitcell is configured to store a respective bit value using the storage circuitry 406. The storage circuitry 406 includes a plurality of transistors forming cross-coupled inverter pairs.

As further shown in FIG. 4, the bitcells of the array of bitcells 404 are arranged in multiple rows and columns. The memory device 400 also includes an opto-electronic decoder 410 configured for selectively illuminating different optical waveguide wordlines. In operation, a computing system can cause the opto-electronic decoder 410 to illuminate individual optical waveguide wordlines one at a time. For instance, the opto-electronic decoder 410 can provide an optical signal to a first optical source inlet 412 to illuminate the LET access devices of bitcells in a first row, and provide an optical signal to a second optical source inlet 414 to illuminate the LET access devices of bitcells in a second row. Similarly, a computing system can cause the opto-electronic decoder 410 to simultaneously illuminate two or more optical waveguide wordlines.

The memory device 400 also differs from the memory device 300 in that the memory device 400 includes a plurality of electrical bitlines. Bitcells of the array of bitcells are coupled to pairs of electrical bitlines. For instance, bitcells in a first column are coupled to a first electrical bitline 416 and a second electrical bitline 418. Bitcells in a second column are coupled to a third electrical bitline 420 and a fourth electrical bitline 422.

The bitcell 304 of FIG. 3 provides improvements over the 6T SRAM cell of FIG. 1. To quantify the potential improvement of the bitcell 304 of FIG. 3 over the 6T SRAM cell of FIG. 1, a design with a moderate size LET based on a generic semiconductor nanowire was considered: L=300 nm (length) and D=50 nm (diameter) and supported on an insulating substrate (e.g., $SiO_2/Si$). Also, a ballistic device with smaller dimensions (L=100 nm (length) and D=30 nm (diameter) was considered.

For the LET structure, there will be no metal-semiconductor (MS)-junction capacitance that is equivalent to the drain or source capacitance (gate-drain or gate-source overlap capacitance along with the drain-substrate or source-substrate junction capacitance) of FETs, since there is neither a gate nor any electrical paths to ground between the MS structure and the substrate that has no electrical connection (only provides mechanical support) as opposed to the doped substrate of FETs. The photocurrents of nanowire photodetectors are typically in the range of 1-10 µA. For the LET access device, the on-current is assumed to be 5 µA. The switching delay, as estimated by the transit time above, is assumed to be around 4 ps and 0.1 ps for the non-ballistic and ballistic cases, respectively.

The critical capacitances of the hybrid 6T SRAM with LET access devices are modified from the $C_{BL}$ and $C_{out}$ calculated in Eqs. (1) and (3) as follows:

$$C'_{BL} = n_R(C_{hr}), \tag{8}$$

$$C'_{out} = C_{drain,M1} C_{drain,M2} C_{gate,M3} C_{gate,M4}, \tag{9}$$

In Eq. (8), the modified bitline capacitance is predominately the wire capacitance only, since the LET access devices do not have any MS junction capacitance as discussed previously. In Eq. (9), there are only the drain and gate capacitances of the core FETs. The drain equivalent capacitance of the access FET is not present in the case of LET access devices due to the same reason. In the LET accessed SRAM, the wordline capacitance in Eq. (2) should be practically zero, since the access LETs neither have any gate capacitance nor require a wired electrical signal to control the gate as in the case of access FETs, and the OWGs that route light do not contribute to any capacitance, nor require a wired electrical signal to control the gates as in the case of access FETs, and the OWGs that route light do not contribute to any capacitance. Accordingly, the read and write delays and the corresponding energies in Eqs. (4)-(7) are modified as below, with $I_{read}$ and $I_{write}$ being replaced by $I'_{read}$ and $I'_{write}$ appropriate for the LET access devices, and all the with $C_{BL}$ and $C_{out}$ being replaced by $C'_{BL}$ and $C'_{out}$, keeping other parameters and values almost unchanged:

$$T_{read,\ LET\_access} = t_{wg} + \max\left(\frac{C'_{BL} \Delta V_{read}}{I'_{read}}, t_{LET}\right), \tag{10}$$

where the RC-wordline delay during read operation in Eq. (4) is replaced by the time taken by the optical signal to propagate through the optical waveguide ($t_{wg}$), and the second term is the larger term of the modified RC-bitline delay during read and the LET carrier transit delay. The first term in Eq. (11) below is the larger term of $t_{wg}$ and the modified bitline delay during write, and the second term is the larger term of the modified 6T cell flipping delay during write and the LET carrier transit delay:

$$T_{write, LET\_access} = \max\left(t_{wg}, \frac{C'_{BL}V_{dd}}{I_{write\_ckt}}\right) + \max\left(\frac{C'_{out}\Delta V_{out}}{I'_{write}}, t_{wg}\right), \quad (11)$$

The wordline energies in Eqs. (6) and (7) (the first terms) will not be present in case of LET accessed cells or arrays, assuming that the light propagation loss through OWG is practically negligible:

$$E_{read, LET\_access} = (2n_C E_{op}) + \max(C'_{Bl}\Delta V_{read} V_{DD}, E_{el}), \quad (12)$$

$$E_{write, LET\_access} = (2n_C E_{op}) + C'_{BL}V_{DD}^2 + \max(C'_{out}V_{DD}\Delta V_{out}, E_{el}), \quad (13)$$

The first terms in both Eqs. (12) and (13) are the optical gating energy and for a whole row it is multiplied by two times the number of 6T cells in a row and each 6T cell has two LET access devices. The second term in Eq. (12) is the larger of the modified bitline RC-read energy, and the LET electrical switching energy, while the last term in Eq. (13) is the larger term of the modified cell flipping RC-energy during write, and the LET electrical switching energy. Therefore, it can be expected that a SRAM array with LETs in the access paths will reduce all the critical capacitances (except for the bitline wires) compared to the array with FET access devices. Also, the carrier transit delay and switching energy (depending on the transit delay) of an LET are much lower compared to the RC delay and switching energy of an FET.

Analytical relations Eqs. (4)-(7) and Eqs. (10)-(13) were used to calculate a set of delay and energy consumptions for various 6T SRAM arrays (32 bytes-64 kB with respectively, FET, LET, and ballistic LET access devices for direct comparison. Despite being approximations, these analytical relations offer more transparent insight into the underlying device physics than numerical simulations.

The values of the currents in the 6T FET SRAM are assumed to be 25 µA, considering the effective drive currents of 22 nm FETs, whereas in the hybrid SRAM, the drive currents are assumed to be 5 µA to match with that of the LETs. In both cases, $\Delta V_{read} \approx 120$ mV and $\Delta V_{out} \approx V_{DD}$ are used.

FIGS. 5A-5D show the read delay, read energy, write delay, and write energy for memory devices with FET, LET, and ballistic LET access devices. The corresponding numerical results for 4 kB and 16 kB arrays are shown in Table 1 below.

may be further minimized if a different layout strategy is considered, where the LETs from two adjacent 6T cells in the same row may be grouped together and illuminated simultaneously in a group with one OWG opening from a separate photonic layer above the electronic layer.

It is clear from the results, as summarized in Table 1, that using LET access devices may result in marked improvement in the overall delay and energy consumption of the SRAM array. From the delay and energy plots of FIGS. 5A-5D, it is found that the results for LET and ballistic LET are almost identical, despite the ballistic device having much lower carrier transit delay and switching energy than non-ballistic LETs. This is because for an array, despite the major improvements associated with the removal of the wordline RC, the overall RC delay and energy (mainly from the bitlines) will dominate over the carrier transit delay and switching energy of the individual LETs.

Figure 5A:
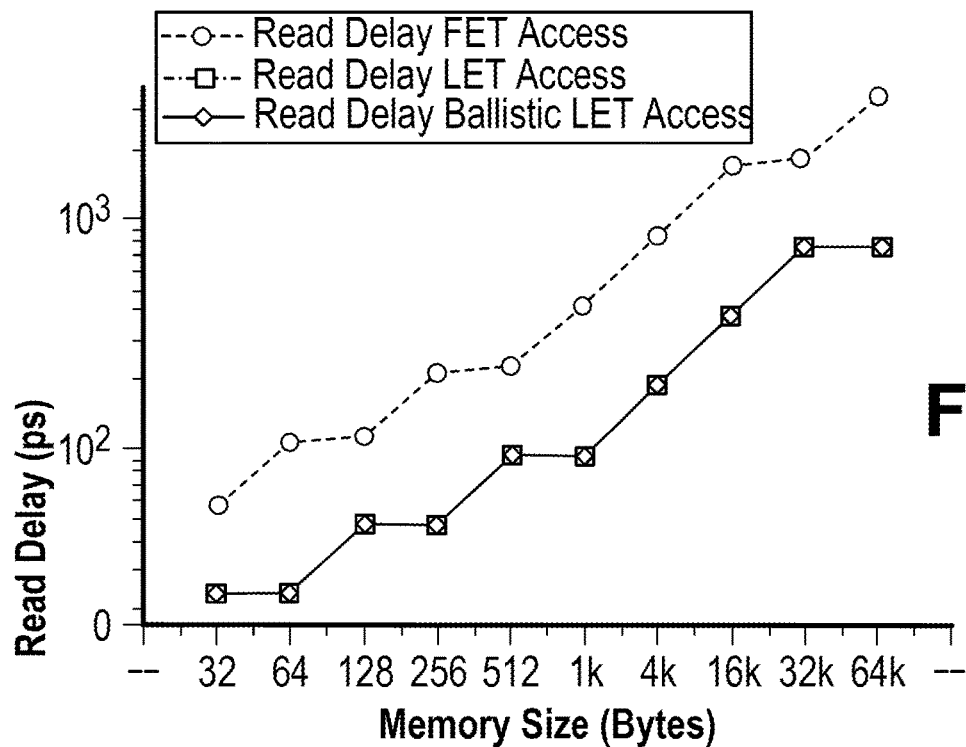
FIGS. 5A-5D show the read delay, read energy, write delay, and write energy for different memory devices with FET, LET, and ballistic LET access devices.
Figure 5B:
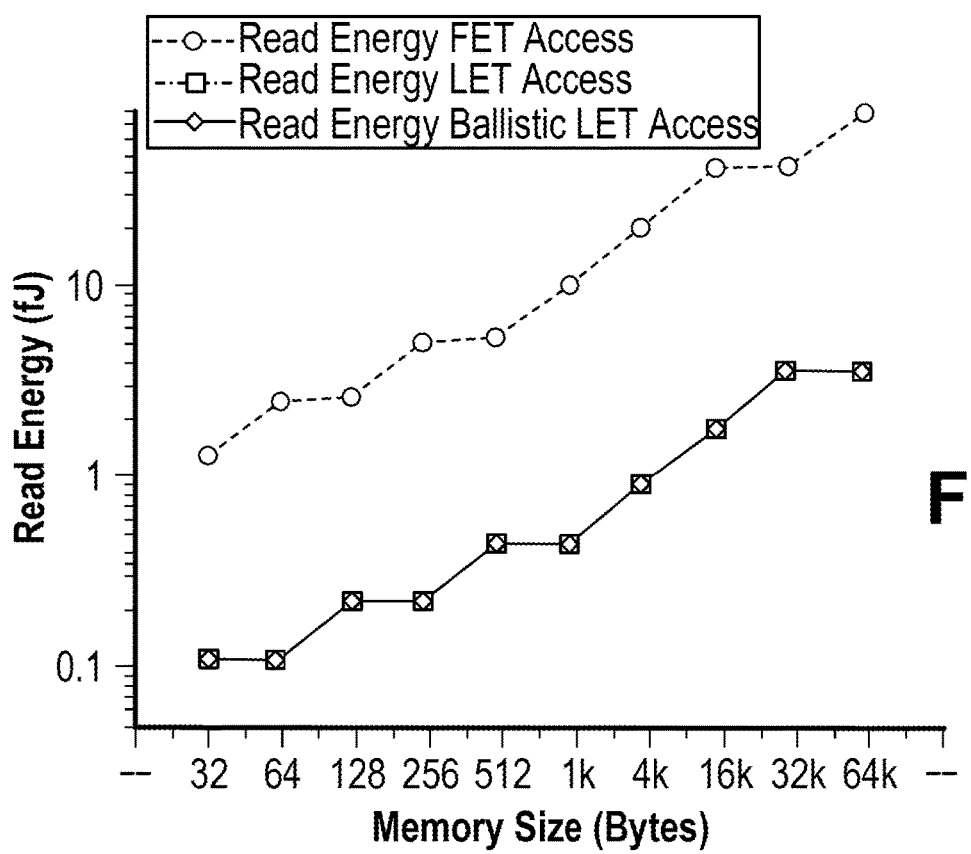
Figure 5C:
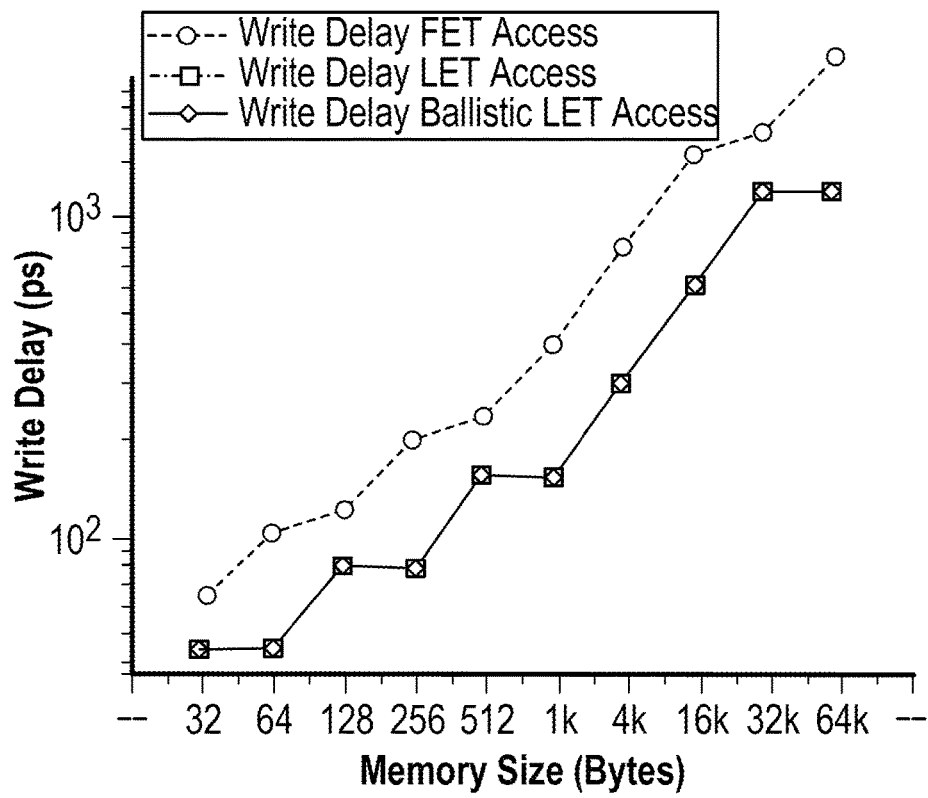
Figure 5D:
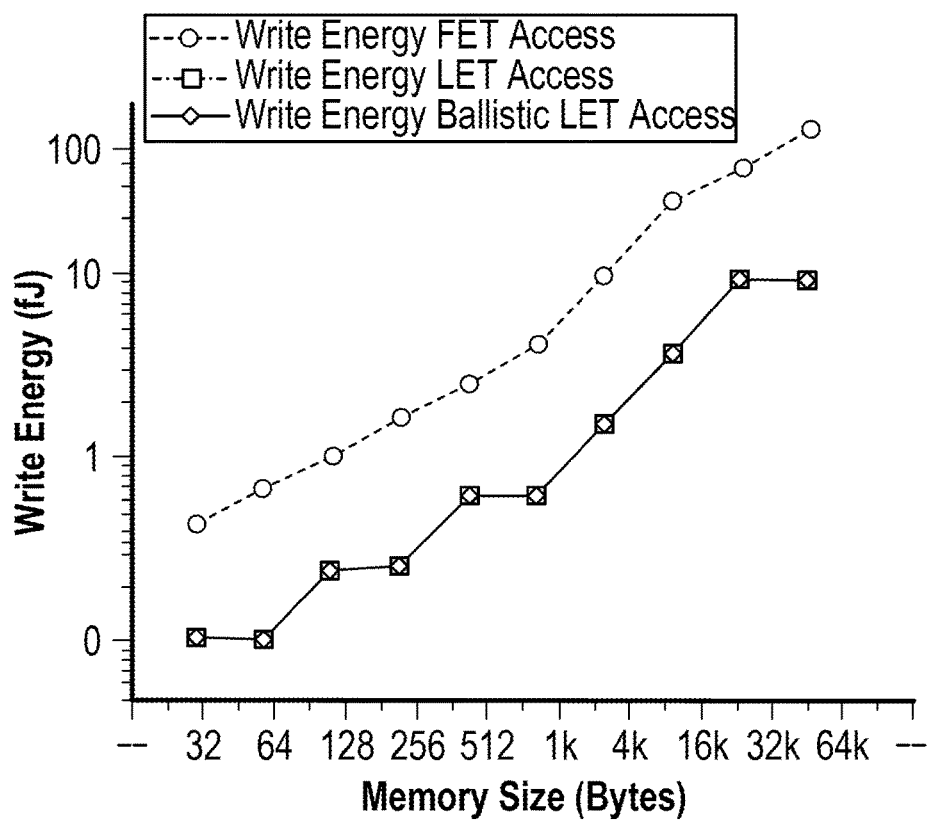

With respect to read delay, FIG. 5A reveals approximately a factor of 4 average reduction with LET access devices over FET access devices. Accordingly, on the read energy, FIG. 5B reflects approximately a factor of 18 average reduction. On write delay, the average reduction shown in FIG. 5C is approximately a factor of 2 average reduction, and on write energy, FIG. 5D shows approximately a factor of 4 average reduction. As summarized in Table 1, the results for both the read and write energies can indeed satisfy the requirement of EDR $\leq 10$ fJ/bit for on-chip photonic integration. The general operating principle, mechanism, and conclusion are in principle applicable for LETs appropriately fabricated with any semiconductor.

The improvement in the read delay of the hybrid 6T SRAM array is primarily due to the removal of the wordline delay in Eq. (4) by the optical waveguide delay in Eq. (10) which is almost negligible compared to the RC wordline delay with FET access devices. The improvement in the write delay is due to the removal of the $C_{WL}$ related term and the reduction of the overall bitline capacitance. Relatively, the improvement in the write delay is less than in the read delay, because the first term in the write delay in Eq. (5) takes the large one of the two contributions, and hence the advantage of replacing the wordline term in Eq. (11) by $t_{wg}$ does not affect the overall write delay as much as it affects the read delay. Also, the highest reduction achieved in the read energy is mainly due to the replacement of the RC

TABLE 1

|  | 4 kB SRAM Array | | | 16 kB SRAM Array | | |
| --- | --- | --- | --- | --- | --- | --- |
|  | FET Access Devices | LET Access Devices | Ballistic LET Access Devices | FET Access Devices | LET Access Devices | Ballistic LET Access Devices |
| Read delay (ps) | 846 | 187 | 187 | 1690 | 374 | 374 |
| Write delay (ps) | 790 | 303 | 303 | 1580 | 598 | 598 |
| Read energy (fJ) | 20.1 | 0.9 | 0.89 | 40.2 | 1.8 | 1.77 |
| Write energy (fJ) | 30 | 7.07 | 7.06 | 59.8 | 14.1 | 14.1 |
| Estimated area (µm²) | 3.67 × 10³ | 5.0 × 10³ | 2.35 × 10³ | 1.47 × 10⁴ | 2.0 × 10⁴ | 9.4 × 10³ |

The areas of the single 6T cells are estimated to be 0.1 µm² for the regular structure, 0.15 µm² and 0.07 µm² for the hybrid structures with LET and ballistic LET access devices respectively. The area of the hybrid 6T cell was estimated considering the similar layout as the conventional 6T cell, but with the access FETs replaced by LETs. Note that the overall area for the hybrid cells (and hence the hybrid arrays)

wordline energy consumption in Eq. (6) (the first term) with FET access devices by a much smaller optical gating term in Eq. (12) (the first term) with LET access devices. Similarly, the improvement in the write energy in Eq. (13) is less than in the read energy in Eq. (12), due to the presence of the second and third terms in Eq. (13) where $V_{DD} > \Delta V_{out} > V_{read}$, and thus $C'_{BL}V_{DD}^2$ in Eq. (13) $> \max(C'_{Bl}\Delta V_{read}V_{DD}, E_{el})$ in Eq. (12), which to some extent lessens the amount of improvement in the write energy compared to the read energy.

In the above analysis, the hybrid 6T SRAM array offers improved performance even with a smaller derive current (by a factor of 5) than the conventional 6T SRAM array. Since much lesser current is needed in the 6T hybrid cell, the core FETs (the FETs in the inverter pairs) can be scaled down to lesser device widths (FET drive current is proportional to the device width), which may offer savings in the area for the 6T cell and hence for the whole array. However, if the on-current of the hybrid 6T SRAM is kept at the same level as the conventional 6T SRAM, the read delay can be further reduced by approximately a factor of 5, but the improvement in write delay is less significant because for a large 6T array it primarily depends on the $I_{write\_ckt}$.

The figure of merit of the SRAM array can be found from the energy-delay product. Considering 50% probability of the array being accessed in a cycle, and 50% probability for each of the read and write operations, it can be roughly estimated that the hybrid SRAM arrays (average EDP on the order of $10^{-24}$ J·s) on an average exhibit more than one order of magnitude lower EDP than the regular SRAM arrays (average EDP of the order of $10^{-23}$ J·s).

In some examples, replacing the FET access devices with LETs in the 6T SRAM abolishes the need for the wordline drivers, which not only reduces the capacitance and the RC-electrical energy consumption of the wordline to practically zero, but may also reduce the capacitance and energy consumption of the column decoder circuitry. It can be roughly estimated that over various array sizes, the hybrid array on average has almost 2 and 3 orders of magnitude lower wordline delay and energy consumption, respectively, than the regular array with wordline drivers.

Figure 6:
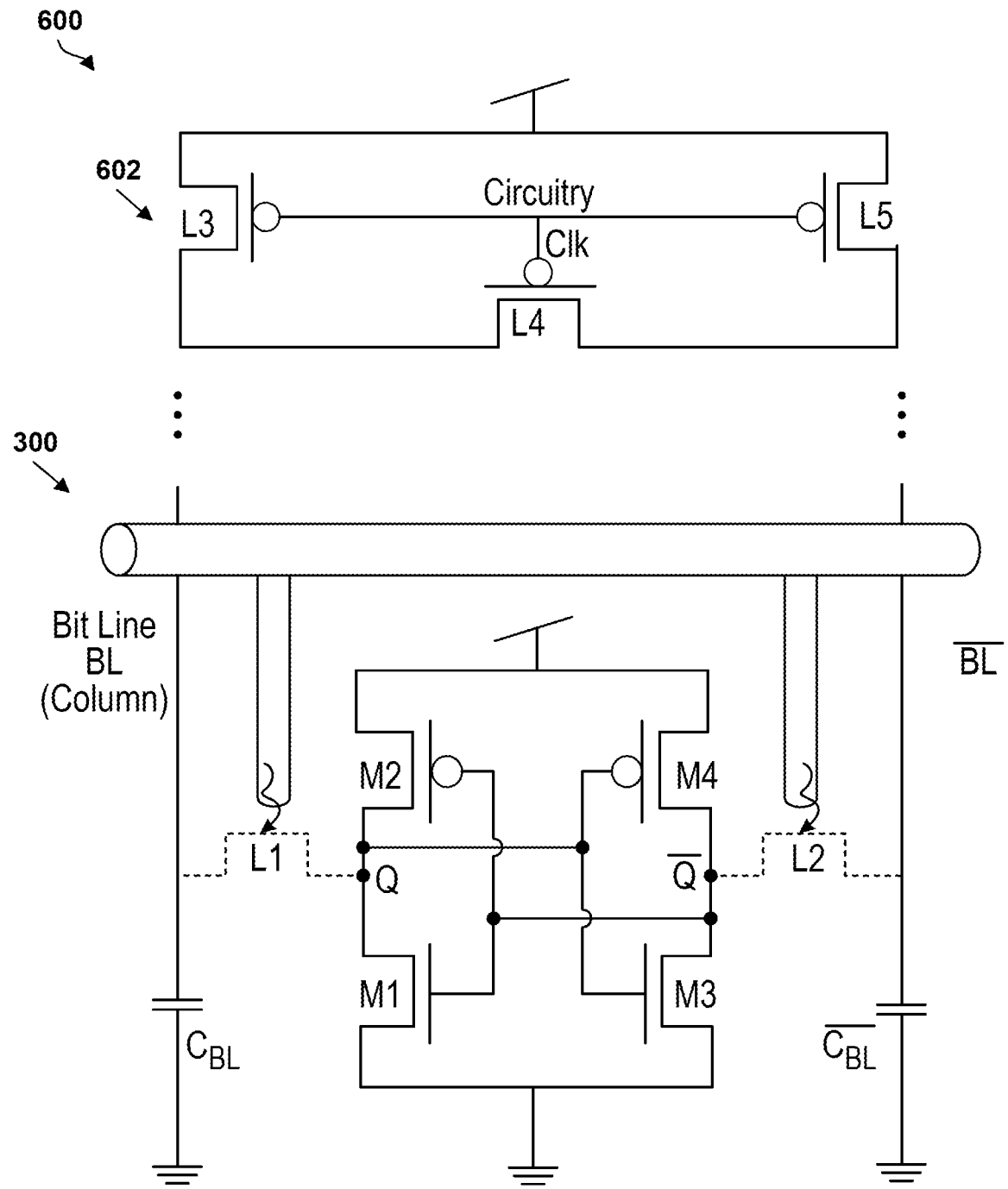
FIG. 6 illustrates another example memory device.

FIG. 6 illustrates another example memory device 600. As shown in FIG. 6, the memory device 600 combines the memory device 300 with bitline conditioning circuitry 602. The role of the bitline conditioning circuitry 602 is to pre-charge and equalize the bitline voltages before read and write operations. Their switching speed and energy consumption affect the performance of the SRAM. The bitline conditioning circuitry 602 includes three LETs L3, L4, L5. The three LETs L3, L4, L5 replace the three p-FETs commonly found in bitline conditioning circuitry, which further reduces the bitline capacitances and hence bitline related delays and energy consumption. This effect is especially true for large 6T arrays.

For the LET structure, all the leakage mechanisms (currents) for the FET mentioned above are eliminated except for the subthreshold current that is equivalent to the dark current of the LET. Since generally doping is not required for the nanowire in the LET, it can have a very low dark current (e.g., of an order of a few pA).

LETs have a different turn-on mechanism and no SCEs of the FETs as discussed above. Hence, hybrid SRAMs will have minimal subthreshold leakage in the access paths. Since LETs do not have a physical gate, there will be neither any gate-related nor any SCE-induced leakage in the access paths, and thus the leakage power consumption in the hybrid SRAM will be much reduced. Also, LETs do not have any unwanted p-n junctions or leakage paths to the ground. Hence, the hybrid SRAM will also have no junction leakage in the access paths, and the overall leakage will be much reduced. It can be estimated that there will be an overall reduction or roughly 35% in the total leakage current in a single hybrid 6T cell, which will be more advantageous in the case of a hybrid 6T array having a large number of 6T cells.

In an example circuit layout of a conventional SRAM cell, the wordline spacing is about two poly pitches, which is of the order of 200 nm for 22 nm technology node and 100 nm for 7 nm technology node, respectively. OWGs fabricated on an insulating substrate can achieve subwavelength lateral size with very low loss, for instance, a SI waveguide of 400 nm for light at 1.55 μm with only 2.8 dB/cm loss. Since photonic properties are scalable with wavelength, for the LETs operating at visible wavelengths, the OWG dimension can be significantly reduced (e.g., to around 140 nm at 532 nm illumination). Further reduction is possible by using plasmonic-dielectric hybrid waveguides, although with somewhat higher loss.

In some examples, to alleviate the size mismatch between the light wavelength and the electronic device, the hybrid SRAM array can have a different circuit layout. For example, the access LETs of multiple bitcells of the same wordline can be arranged together such that they can be optically addressed as a group. This scheme can not only use the optical energy more efficiently but may also increase the space of the OWG openings. Additionally, for situations where improving performance is more important than saving space, the hybrid SRAM array could feature a larger waveguide spacing. OWGs are sometimes used for interconnection between different circuits. In the hybrid SRAM, the optical paths can be substantially shorter for on-chip operation. Thus, the scalability of a few hundred or even one thousand cells/WL is not expected to be an issue for propagation loss. The minimum light power output required from the optical decoder can be estimated to be of the order of only 8.5 μW per OWG for 1600 cells/WL, considering a propagation loss of 2.8 dB/cm and an overestimated OWG length of 1 mm, and using the optical gating power estimate above (2.5 nW/LET), which leaves a larger room for less efficient implementation.

LETs offer high-speed and low-energy opto-electronic switching, where the switching delay is limited by carrier transit time, which can be made extremely small using the nanowire-based device, particularly in the ballistic transport mode. In contrast, in FETs, it is generally RC switching and hence is much less energy efficient due to high gate-related capacitances in FETs. The biggest advantage of replacing the FET access devices with LETs is that the gate, source, and drain related capacitance and electrical wordlines are no longer present, which removes the wordline delay as well as energy consumption. From the above delay and energy calculations of the hybrid 6T SRAM using LET access transistors, it can be concluded that the new hybrid 6T SRAM array is much more energy efficient with lesser read and write delays than the all FET 6T cells and arrays. In addition, LETS are expected to have much lower leakage currents than convention FETs, and thus the hybrid 6T cell and array will have much lower leakage power dissipation than those with FET access devices. The use of the optical waveguide-based wordline architecture in the hybrid SRAM array can abolish the need for electrical wordlines and also the wordline drivers, which will drastically reduce the total wordline capacitance, RC-delay, and energy consumption to almost negligible compared to that in the conventional SRAM array. Furthermore, LETs may find useful applications in other peripheral and assist circuits of the SRAM array like the bitline conditioning circuit for improvements in speed and energy consumption. The hybrid SRAM architecture disclosed herein offers an example of a hybrid electronic-photonic integrated circuit with both electronic and photonic devices playing active roles synergistically.

Figure 7:
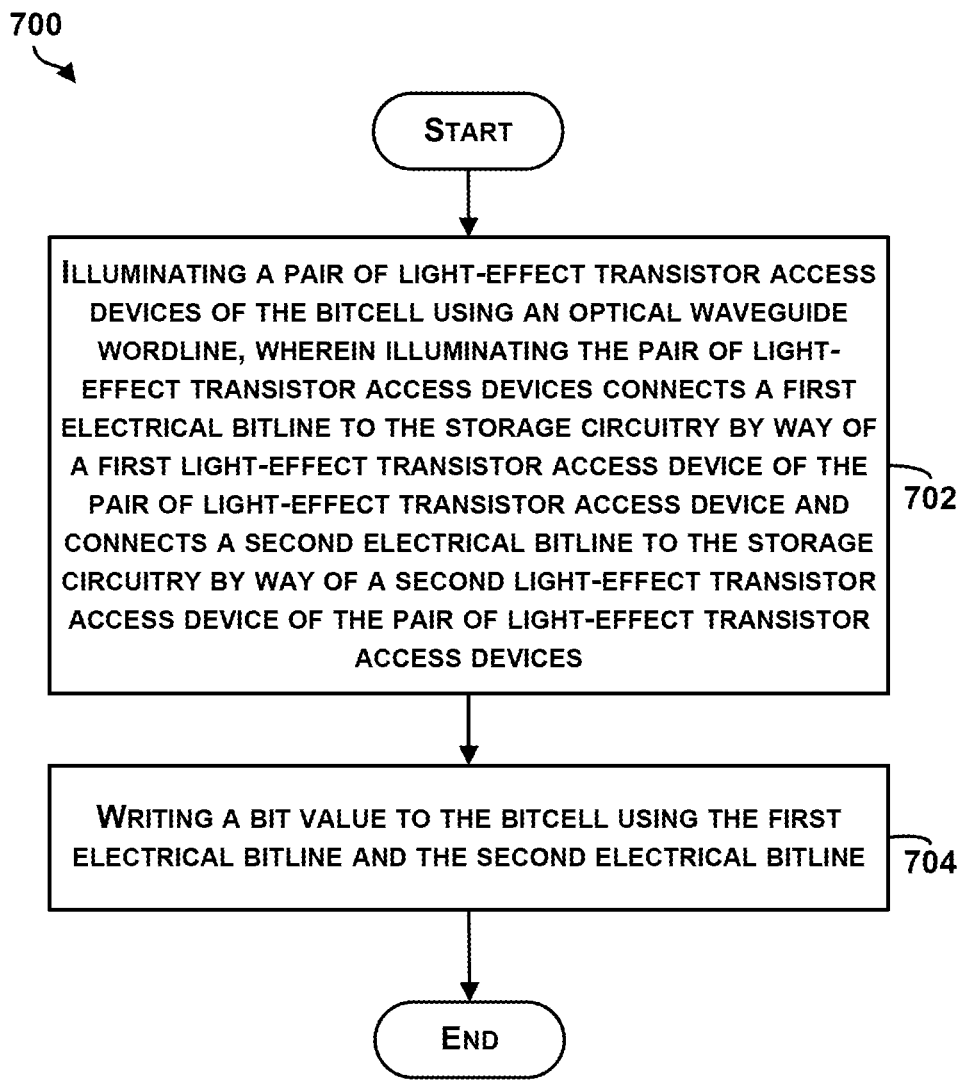
FIG. 7 is a flow chart of an example method of accessing a bitcell of a memory device.

FIG. 7 is a flow chart of an example method 700 of accessing a bitcell of a memory device. Method 700 shown in FIG. 7 presents an embodiment of a method that, for example, may be performed by one or more computing devices (or components of one or more computing devices) with respect to the memory device 300 of FIG. 3, the memory device 400 of FIG. 4, or the memory device 600 of FIG. 6. Example devices or systems may be used or configured to perform logical functions presented in FIG. 7. In some instances, components of the devices and/or systems may be configured to perform the functions such that the components are actually configured and structured (with hardware and/or software) to enable such performance. In other examples, components of the devices and/or systems may be arranged to be adapted to, capable of, or suited for performing the functions. Method 700 may include one or more operations, functions, or actions as illustrated by one or more of blocks 702-704. Although the blocks are illustrated in a sequential order, these blocks may also be performed in parallel, and/or in a different order than those described herein. Also, the various blocks may be combined into fewer blocks, divided into additional blocks, and/or removed based upon the desired implementation.

It should be understood that for this and other processes and methods disclosed herein, flowcharts show the functionality and operation of one possible implementation of present embodiments. In this regard, each block may represent a module, a segment, or a portion of program code, which includes one or more instructions executable by a processor for implementing specific logical functions or steps in the process. The program code may be stored on any type of computer readable medium or data storage, for example, such as a storage device including a disk or hard drive. The computer readable medium may include non-transitory computer readable medium or memory, for example, such as computer-readable media that stores data for short periods of time like register memory, processor cache and Random Access Memory (RAM). The computer readable medium may also include non-transitory media, such as secondary or persistent long term storage, like read only memory (ROM), optical or magnetic disks, compact-disc read only memory (CD-ROM), for example. The computer readable media may also be any other volatile or non-volatile storage systems. The computer readable medium may be considered a tangible computer readable storage medium, for example.

In addition, each block in FIG. 7 may represent circuitry that is wired to perform the specific logical functions in the process. Alternative implementations are included within the scope of the example embodiments of the present disclosure in which functions may be executed out of order from that shown or discussed, including substantially concurrent or in reverse order, depending on the functionality involved, as would be understood by those skilled in the art.

At block 702, the method 700 includes illuminating a pair of LET access devices of a bitcell using an OWG wordline. For example, the bitcell may be a bitcell of the memory device 300, the memory device 400, or the memory device 600. The pair of LET access devices can be illuminated using an illumination source that generates an optical signal, such as a nanoscale laser. The OWG wordline can route the optical signal to semiconductor nanowires of the pair of LET access devices. Illuminating the pair of LET access devices connects a first electrical bitline to storage circuitry by way of a first LET access device of the pair of LET access devices and connects a second electrical bitline to the storage circuitry by way of a second LET access device of the pair of LET access devices.

At block 704, the method 700 includes writing a bit value to the bitcell using the first electrical bitline and the second electrical bitline. In some examples, writing the bit value involves applying a value to be written to the bitlines. For instance, to write a zero, the first electrical bitline can be set to zero, and the second electrical bitline can be set to its complement (i.e. one). Similarly, to write a one, the first electrical bitline can be set to one, and the second electrical bitline can be set to its complement (i.e. zero).

Figure 8:
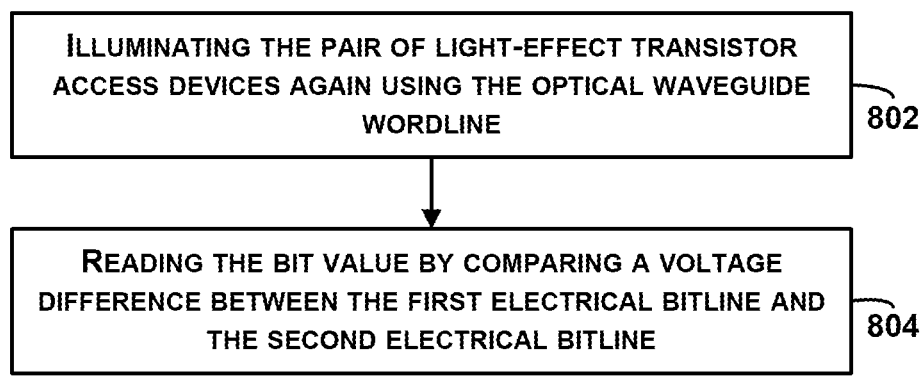
FIG. 8 shows additional operations for use with the method shown in FIG. 7.

FIG. 8 shows additional operations for use with the method 700 shown in FIG. 7. Blocks 802 and 804 could be performed after block 704 of FIG. 7.

At block 802, FIG. 8 includes illuminating the pair of LET access devices again using the OWG wordline. And at block 804, FIG. 8 includes reading the bit value by comparing a voltage difference between the first electrical bitline and the second electrical bitline. In some examples, a sense amplifier (e.g., a differential amplifier) is used to compare the voltage difference. For instance, if a voltage on the first electrical bitline is greater than a voltage on the second electrical bitline, a computing system can interpret the voltage difference to mean that the bit value is one. Whereas, if a voltage on the second electrical bitline is greater than a voltage on the first electrical bitline, a computing system can interpret the voltage difference to mean that the bit value is zero.

Figure 9:
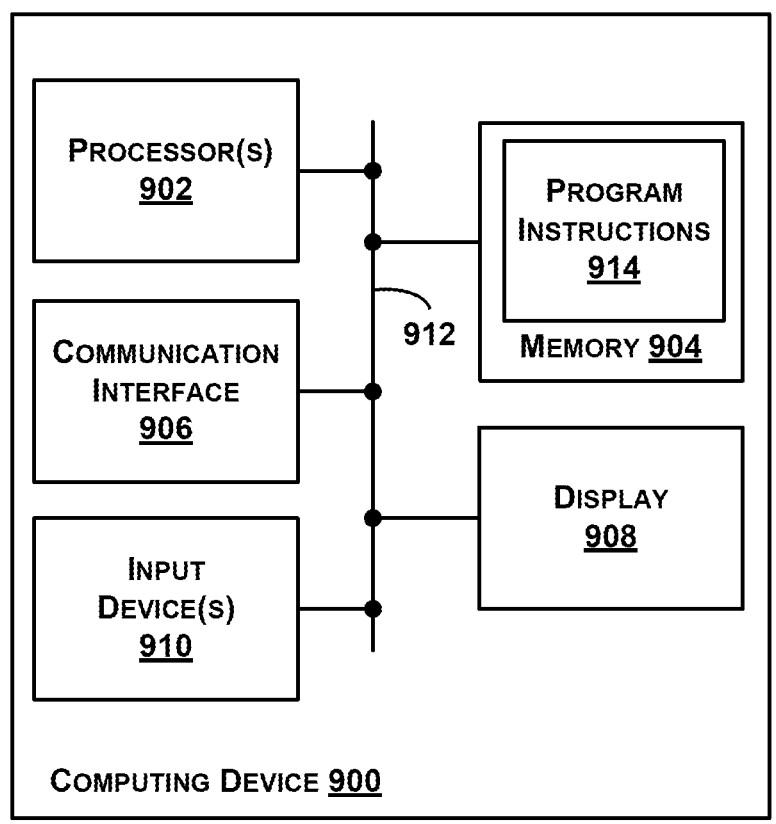
FIG. 9 is a schematic diagram of an example computing device 900.

As mentioned, portions of the method 700 may be performed by one or more computing devices (or components of one or more computing devices). FIG. 9 is a schematic diagram of an example computing device 900. In some examples, some components illustrated in FIG. 9 may be distributed across multiple computing devices. However, for the sake of example, the components are shown and described as part of one example computing device 900. The computing device 900 may be or include a mobile device, desktop computer, email/messaging device, tablet computer, or similar device that may be configured to perform the functions described herein.

As shown in FIG. 9, the computing device 900 may include one or more processors 902, a memory 904, a communication interface 906, a display 908, and one or more input devices 910. Components illustrated in FIG. 9 may be linked together by a system bus, network, or other connection mechanism(s) 912. The computing device 900 may also include hardware to enable communication within the computing device 900 and between the computing device 900 and another computing device (not shown), such as a server entity. The hardware may include transmitters, receivers, and antennas, for example.

The one or more processors 902 may be any type of processor, such as a microprocessor, digital signal processor, multicore processor, etc., coupled to the memory 904. The memory 904 may be any type of memory, such as volatile memory like random access memory (RAM), dynamic random access memory (DRAM), static random access memory (SRAM), or non-volatile memory like read-only memory (ROM), flash memory, magnetic or optical disks, or compact-disc read-only memory (CD-ROM), among other devices used to store data or programs on a temporary or permanent basis.

Additionally, the memory 904 may be configured to store program instructions 914. The program instructions 914 may be executable by the one or more processors 902. For instance, the program instructions 914 may cause the one or more processors 902 to perform any of the functions of methods 700 and 800, or any of the functions described herein.

The communication interface 906 may be configured to facilitate communication with one or more other devices, in accordance with one or more wired or wireless communication protocols. For example, the communication interface 906 may be configured to facilitate wireless data communication for the computing device 900 according to one or more wireless communication standards, such as one or more IEEE 802.11 standards, ZigBee standards, Bluetooth standards, etc. As another example, the communication interface 906 may be configured to facilitate wired data communication with one or more other computing devices, such as one or more cloud-connected computing devices or servers.

The display 908 may be any type of display component configured to display data. As one example, the display 908 may include a touchscreen display. As another example, the display may include a flat-panel display, such as a liquid-crystal display (LCD) or a light-emitting diode (LED) display.

The one or more input devices 910 may include one or more pieces of hardware equipment used to provide data and control signals to the computing device 900. For instance, the one or more input devices 910 may include a mouse or pointing device, a keyboard or keypad, a microphone, a touchpad, a touchscreen, or a camera, among other possible types of input devices.

The description of the different advantageous arrangements has been presented for purposes of illustration and description, and is not intended to be exhaustive or limited to the embodiments in the form disclosed. Many modifications and variations will be apparent to those of ordinary skill in the art. Further, different advantageous embodiments may provide different advantages as compared to other advantageous embodiments. The embodiment or embodiments selected are chosen and described in order to best explain the principles of the embodiments and the practical application, and to enable others of ordinary skill in the art to understand the disclosure for various embodiments with various modifications as suited to the particular use contemplated.

What is claimed is:

1. A memory device comprising:
   a first electrical bitline;
   a second electrical bitline;
   a bitcell configured to store a bit value, the bitcell comprising:
      storage circuitry comprising at least one transistor, and
      a pair of light-effect transistor access devices arranged for connecting the bitcell to the first electrical bitline and the second electrical bitline; and
   an optical waveguide wordline arranged for routing an optical signal to the pair of light-effect transistor access devices.

2. The memory device of claim 1, wherein:
   a first light-effect transistor access device of the pair of light-effect transistor access devices is coupled to the first electrical bitline, and
   a second light-effect transistor access device of the pair of light-effect transistor access devices is coupled to the second electrical bitline.

3. The memory device of claim 1, wherein the storage circuitry comprises a plurality of field-effect transistors.

4. The memory device of claim 1, wherein the storage circuitry comprises a pair of cross-coupled inverters.

5. The memory device of claim 1, wherein:
   each light-effect transistor access device of the pair of light-effect transistor access devices comprises a semiconductor nanowire connecting a first metal contact to a second metal contact, and
   the optical waveguide wordline is arranged for coupling the optical signal to the semiconductor nanowires of the light-effect transistor access devices of the pair of light-effect transistor access devices.

6. The memory device of claim 1, further comprising bitline conditioning circuitry configured to pre-charge and equalize bitline voltages of the first electrical bitline and the second electrical bitline, wherein the bitline conditioning circuitry comprises light-effect transistors.

7. The memory device of claim 1, wherein the bitcell is a random-access memory bitcell.

8. The memory device of claim 7, wherein the random-access memory bitcell is a static random-access memory bitcell.

9. The memory device of claim 1, wherein the memory device is an integrated circuit.

10. A memory device comprising:
    an array of bitcells, wherein each bitcell of the array of bitcells is configured to store a respective bit value using storage circuitry comprising at least one transistor, and wherein each bitcell of the array of bitcells comprises a pair of light-effect transistor access devices arranged for connecting the bitcell to a pair of corresponding electrical bitlines; and
    an optical waveguide wordline arranged for routing an optical signal to a pair of light-effect transistor access devices of a bitcell of the array of bitcells.

11. The memory device of claim 10, wherein the optical waveguide wordline is arranged for routing the optical signal to a pair of light-effect transistor access devices of another bitcell of the array of bitcells.

12. The memory device of claim 10, wherein:
    the array of bitcells comprises a first row of one or more bitcells and a second row of one or more bitcells,
    the optical waveguide wordline is arranged for routing the optical signal to a pair of light-effect transistor access devices of a bitcell of the first row of one or more bitcells, and
    the memory device further comprises another optical waveguide wordline arranged for routing an optical signal to a pair of light-effect transistor access devices of a bitcell of the second row of one more bitcells.

13. The memory device of claim 12, further comprising an opto-electronic decoder configured for selectively illuminating the optical waveguide wordline and the additional optical waveguide wordline.

14. The memory device of claim 10, wherein:
    the array of bitcells comprises a first column of one or more bitcells and a second column of one or more bitcells
    the pair of light-effect transistor access devices of a first bitcell of the first column connects the first bitcell to a first electrical bitline and a second electrical bitline, and
    the pair of light-effect transistor access devices of a second bitcell of the second column connects the second bitcell to a third electrical bitline and a fourth electrical bitline.

15. The memory device of claim 10, wherein the storage circuitry of the bitcell comprises a plurality of field-effect transistors.

16. The memory device of claim 10, wherein the storage circuitry of the bitcell comprises a pair of cross-coupled inverters.

17. The memory device of claim 10, wherein:
- for a given bitcell of the array of bitcells, each light-effect transistor access device of the pair of light-effect transistor access devices of the given bitcell comprises a semiconductor nanowire connecting a first metal contact to a second metal contact, and
- the optical waveguide wordline is arranged for coupling the optical signal to the semiconductor nanowires of the light-effect transistor access devices of the pair of light-effect transistor access devices of the given bitcell.

18. A method of accessing a bitcell of a memory device, wherein the bitcell comprises storage circuitry comprising at least one transistor, the method comprising:
- illuminating a pair of light-effect transistor access devices of the bitcell using an optical waveguide wordline, wherein illuminating the pair of light-effect transistor access devices connects a first electrical bitline to the storage circuitry by way of a first light-effect transistor access device of the pair of light-effect transistor access devices and connects a second electrical bitline to the storage circuitry by way of a second light-effect transistor access device of the pair of light-effect transistor access devices; and
- writing a bit value to the bitcell using the first electrical bitline and the second electrical bitline.

19. The method of claim 18, further comprising after writing the bit value to the bitcell;
- illuminating the pair of light-effect transistor access devices again using the optical waveguide wordline; and
- reading the bit value by comparing a voltage difference between the first electrical bitline and the second electrical bitline.

20. The method of claim 18, wherein:
- the storage circuitry comprises a plurality of field-effect transistors; and
- each light-effect transistor access device of the pair of light-effect transistor access devices comprises a semiconductor nanowire connecting a first metal contact to a second metal contact, and
- illuminating the pair of light-effect transistor access devices comprises illuminating the semiconductor nanowires of the pair of light-effect transistor access devices.

* * * * *